US 012593398B2

(12) United States Patent (10) Patent No.: US 12,593,398 B2
Tsuji (45) Date of Patent: Mar. 31, 2026

(54) FLEXIBLE WIRING BOARD AND LIGHT CONTROL UNIT

(71) Applicant: TOPPAN Inc., Tokyo (JP)

(72) Inventor: Masaki Tsuji, Taito-ku (JP)

(73) Assignee: TOPPAN Inc., Tokyo (JP)

( * ) Notice: Subject to any disclaimer, the term of this patent is extended or adjusted under 35 U.S.C. 154(b) by 167 days.

(21) Appl. No.: 18/411,513

(22) Filed: Jan. 12, 2024

(65) Prior Publication Data

US 2024/0155762 A1    May 9, 2024

Related U.S. Application Data

(63) Continuation of application No. PCT/JP2022/027776, filed on Jul. 14, 2022.

(30) Foreign Application Priority Data

Jul. 14, 2021    (JP) .................................. 2021-116619

(51) Int. Cl.
*H05K 1/02* (2006.01)
*H05K 3/321* (2026.01)
*H05K 3/34* (2006.01)

(52) U.S. Cl.
CPC .............. *H05K 1/028* (2013.01); *H05K 3/321* (2013.01); *H05K 3/3405* (2013.01); *H05K 2201/055* (2013.01); *H05K 2201/10121* (2013.01)

(58) Field of Classification Search
CPC ...... H05K 1/028; H05K 3/321; H05K 3/3405; H05K 2201/10121

USPC .......................................................... 174/254
See application file for complete search history.

(56) References Cited

U.S. PATENT DOCUMENTS 9,425,158 B2 * 8/2016 Iihola ...................... H01L 24/82
2011/0132642 A1 6/2011 Shinoda et al.
2015/0342033 A1 * 11/2015 Hasegawa .............. H05K 1/028
174/254

FOREIGN PATENT DOCUMENTS

| CN | 106773391 A | 5/2017 |
| JP | 2007-057925 A | 3/2007 |
| JP | 2012-060043 A | 3/2012 |
| JP | 2020-038265 A | 3/2020 |

OTHER PUBLICATIONS

Extended European Search Report issued on Dec. 10, 2024 in European Patent Application No. 22842189.7, 11 pages.
International Search Report issued Oct. 4, 2022 in PCT/JP2022/027776, filed Jul. 14, 2022, 5 pages.

* cited by examiner

*Primary Examiner* — Andargie M Aychillhum
(74) *Attorney, Agent, or Firm* — Oblon, McClelland, Maier & Neustadt, L.L.P.

(57) ABSTRACT

A flexible wiring board includes an insulating layer having a support surface extending in a first direction; a first sheet adhesive terminal positioned on the support surface; and a second sheet adhesive terminal positioned on the support surface. The shape of the first sheet adhesive terminal and the shape of the second sheet adhesive terminal are point-symmetric about a point on a straight fold line on which straight guide lines extending in the first direction lie.

15 Claims, 9 Drawing Sheets

FIG.4

FLEXIBLE WIRING BOARD AND LIGHT CONTROL UNIT

CROSS-REFERENCE TO RELATED APPLICATIONS

The present application is a continuation of and claims the benefit of priority to International Application No. PCT/JP2022/027776, filed Jul. 14, 2022, which is based upon and claims the benefit of priority to Japanese Application No. 2021-116619, filed Jul. 14, 2021. The entire contents of these applications are incorporated herein by reference.

BACKGROUND OF THE INVENTION

Field of the Invention

The present invention relates to a flexible wiring board including adhesive terminals facing in opposite directions, and a light control unit including the flexible wiring board.

Description of Background Art

JP 2007-57925 A and JP 2020-38265 A describe light control sheets including two transparent electrode layers facing each other. The entire contents of these publications are incorporated herein by reference.

SUMMARY OF THE INVENTION

According to one aspect of the preset invention, a flexible wiring board includes an insulating layer having a support surface extending in a first direction, a first sheet adhesive terminal positioned on the support surface and extending in the first direction, and a second sheet adhesive terminal positioned on the support surface and extending in the first direction. A shape of the first sheet adhesive terminal and a shape of the second sheet adhesive terminal are point-symmetric about a point on a straight fold line extending in the first direction.

According to another aspect of the preset invention, a flexible wiring board includes an insulating layer having a support surface extending in a first direction, a first sheet adhesive terminal positioned on the support surface, a second sheet adhesive terminal positioned on the support surface, and a weakened part that is formed on a straight fold line extending in the first direction and induces the flexible wiring board to fold along the straight fold line. The first sheet adhesive terminal is spaced from the second sheet adhesive terminal in the first direction and is positioned on a side of the straight fold line opposite to a side on which the second sheet adhesive terminal is positioned.

According to yet another aspect of the preset invention, a light control unit includes a light control sheet having an edge part extending in a first direction, and a flexible wiring board bonded to the edge part of the light control sheet. The light control sheet includes a first transparent electrode layer having a first transparent electrode terminal on a first electrode surface, a second transparent electrode layer having a second transparent electrode terminal on a second electrode surface, and a light control layer positioned between the first and second electrode surfaces such that the first and second transparent electrode terminals are exposed from the light control layer, the first and second transparent electrode terminals constitute the edge part and are positioned in the first direction, the flexible wiring board includes an insulating layer including a support surface extending in the first direction, a first sheet adhesive terminal bonded to the first transparent electrode terminal, positioned on the support surface and extending in the first direction, and a second sheet adhesive terminal bonded to the second transparent electrode terminal, positioned on the support surface and extending in the first direction, the support surface is folded along a straight fold line extending in the first direction, and the first sheet adhesive terminal has a shape obtained by translating a shape of the second sheet adhesive terminal along the straight fold line.

According to still another aspect of the preset invention, a light control unit includes a light control sheet having an edge part extending in a first direction, and a flexible wiring board bonded to the edge part of the light control sheet. The light control sheet includes a first transparent electrode layer having a first transparent electrode terminal on a first electrode surface, a second transparent electrode layer having a second transparent electrode terminal on a second electrode surface, and a light control layer positioned between the first and second electrode surfaces such that the first and second transparent electrode terminals are exposed from the light control layer, the first and second transparent electrode terminals constitute the edge part and are positioned in the first direction, the flexible wiring board includes an insulating layer including a support surface extending in the first direction, a first sheet adhesive terminal bonded to the first transparent electrode terminal and positioned on the support surface, and a second sheet adhesive terminal bonded to the second transparent electrode terminal and is positioned on the support surface, the support surface is folded along a straight fold line extending in the first direction, and the first sheet adhesive terminal is spaced from the second sheet adhesive terminal in the first direction and is positioned on the support surface on a side of the straight fold line opposite to a side on which the second sheet adhesive terminal is positioned.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a plan view showing the plan structure of the flexible wiring board;

DETAILED DESCRIPTION OF THE EMBODIMENTS

Figure 1:
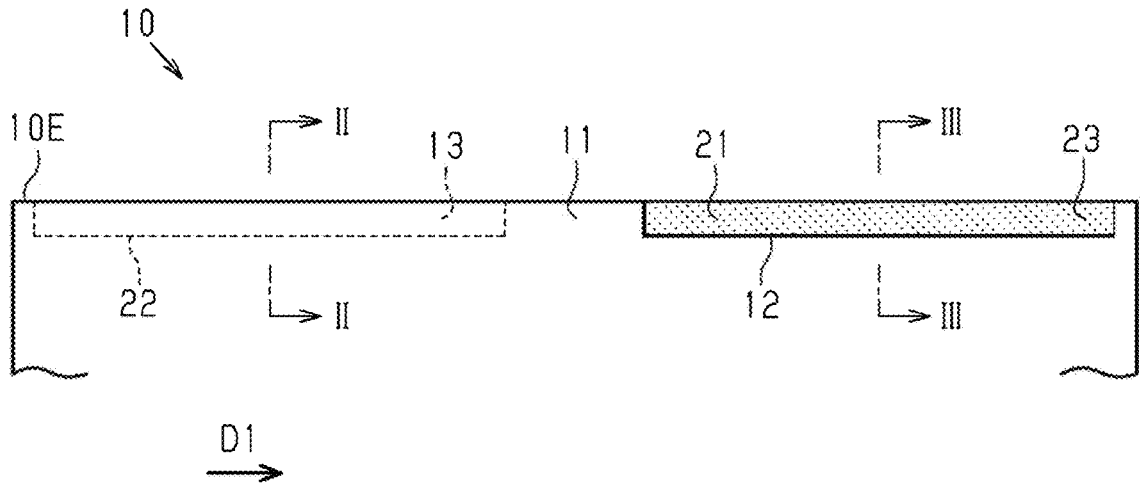
FIG. 1 is an enlarged plan view of transparent electrode terminals on a light control sheet.

Embodiments will now be described with reference to the accompanying drawings, wherein like reference numerals designate corresponding or identical elements throughout the various drawings.

An embodiment including a flexible wiring board and a light control unit will be described. First, the configuration of a light control sheet to which the flexible wiring board is bonded will be explained. The configuration of the flexible wiring board will be explained thereafter. Finally, a light control unit including the light control sheet and the flexible wiring board bonded to the light control sheet will be described.

Light Control Sheet

As shown in FIG. 1, a light control sheet 10 has an edge 10E that extends linearly in a first direction D1. The light control sheet 10 has a first transparent electrode layer 11, a second transparent electrode sheet 21, and a light control layer 31 (see FIG. 2). The light control sheet 31 is located between the first and second transparent electrode sheets 11 and 21. The light control sheet 10 divides the space in which the light control sheet 10 is located into two. Of the two spaces partitioned by the light control sheet 10, the space in contact with the first transparent electrode sheet 11 is a first space. Of the two spaces partitioned by the light control sheet 10, the space in contact with the second transparent electrode sheet 21 is a second space.

Figure 2:
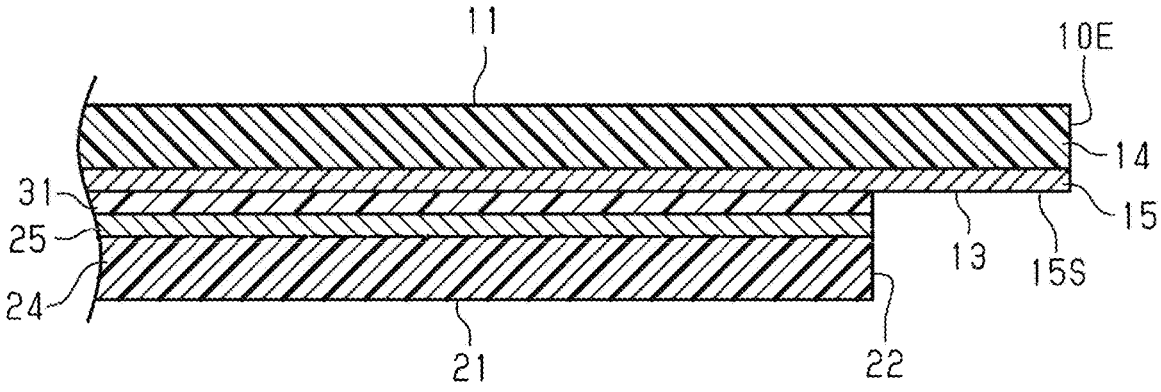
FIG. 2 is a cross-sectional view taken along line II-II in FIG. 1.

As shown in FIG. 2, the first transparent electrode sheet 11 includes a first support film 14 and a first transparent electrode layer 15. The second transparent electrode sheet 21 includes a second support film 24 and a second transparent electrode layer 25. The first transparent electrode layer 15 is disposed on the first support film 14 on a side facing the second transparent electrode sheet 21 and is in contact with the light control layer 31. The second transparent electrode layer 25 is disposed on the second support film 24 on a side facing the first transparent electrode sheet 11 and is in contact with the light control layer 31. The light control layer 31 located between the first and second transparent electrode layers 15 and 25 is driven by applying a voltage between the first and second transparent electrode layers 15 and 25. Note that the light control sheet 10 may further include an alignment layer between the first transparent electrode layer 15 and the light control layer 31. The light control sheet 10 may also include an alignment layer between the second transparent electrode layer 25 and the light control layer 31.

The support films 14 and 24 both transmit visible light and are electrically insulating. The material of the support films 14 and 24 is an organic polymer compound or an inorganic polymer compound. An example of the organic polymer compound is at least one selected from a group of polyester, polyacrylate, polycarbonate, and polyolefin. An example of the inorganic polymer compound is at least one selected from a group of silicon dioxide, silicon oxynitride, and silicon nitride.

The transparent electrode layers 15 and 25 both transmit visible light and are electrically conductive. An example of the material of the transparent electrode layers 15 and 25 is at least one selected from a group of indium tin oxide, fluorine-doped tin oxide, tin oxide, zinc oxide, carbon nanotubes, and poly 3,4-ethylenedioxythiophene.

The light control layer 31 makes the light transmittance after voltage application different from the light transmittance before voltage application. An example of the light control layer 31 includes a transparent organic polymer layer and a liquid crystal composition. The transparent organic polymer layer defines a gap between the first and second transparent electrode layer 15 and 25, the gap being filled with the liquid crystal composition. The liquid crystal composition is filled in the gap in the transparent organic polymer layer. The liquid crystal composition includes a liquid crystal compound. An example of the liquid crystal compound is at least one selected from a group of Schiff base compounds, azo compounds, azoxy compounds, biphenyl compounds, terphenyl compounds, benzoic acid ester compounds, tolan compounds, pyrimidine compounds, cyclohexanecarboxylic acid ester compounds, phenylcyclohexane compounds, and dioxane compounds.

The type in which the liquid crystal composition is held in the light control layer 31 is one selected from a group of a polymer network type, a polymer dispersion type, and a capsule type. The polymer network type has a transparent three-dimensional mesh polymer network and holds the liquid crystal composition in the voids in the mesh polymer network. The polymer network is an example of the transparent organic polymer layer. The polymer dispersed type has a large number of isolated voids in the transparent organic polymer layer and holds the liquid crystal composition in the voids dispersed in the polymer layer. The capsule type holds an encapsulated liquid crystal composition in the transparent organic polymer layer. Note that the liquid crystal composition may contain, in addition to the above-mentioned liquid crystal compound, a monomer for forming the transparent organic polymer layer, and a dichroic dye.

Returning to FIG. 1, the first transparent electrode sheet 11 and the light control layer 31 are provided with, at the edge 10E of the light control sheet 10, a first terminal opening 12. The first terminal opening 12 extends from the edge 10E of the light control sheet 10 toward the inside of the light control sheet 10. The first terminal opening 12 exposes a part of the second transparent electrode sheet 21 to the first space defined by the light control sheet 10.

The second transparent electrode sheet 21 and the light control layer 31 are provided with, at the edge 10E, a second terminal opening 22. The second terminal opening 22 extends from the edge 10E of the light control sheet 10 toward the inside of the light control sheet 10. The second terminal opening 22 exposes a part of the transparent electrode sheet 21 to the second space defined by the light control sheet 10.

The first and second terminal openings 12 and 22 are located next to each other along the edge 10E of the light control sheet 10 with a gap between them. The first terminal opening 12 has a shape corresponding to the shape of the second terminal opening 22 translated in the first direction D1. Note that the first terminal opening 12 may have a shape that is different from the shape of the second terminal opening 22 translated in the first direction D1.

In FIG. 1, for the sake of convenience in explaining the positions of the terminal openings 12 and 22 in the thickness direction of the light control sheet 10, the part of the first transparent electrode sheet 11 that is exposed to the second space is surrounded with a dotted line. In addition, the part of the second transparent electrode sheet that is exposed to the first space is represented by the dotted area.

As shown in FIG. 2, a first electrode surface 15S of the first transparent electrode layer facing the light control layer 31 extends from the second terminal opening 22 to the edge 10E. The second terminal opening 22 defines the first transparent electrode terminal 13, which is a part of the first electrode surface 15S, in the first transparent electrode layer

15. The first transparent electrode terminal 13 is the part of the first electrode surface 15S surrounded by the second terminal opening 22 and the edge 10E of the light control sheet 10.

The second terminal opening 22 may be formed by cutting out a part of the second transparent electrode sheet 21 and a part of the light control layer 31. Alternatively, the second terminal opening 22 may be formed at a part of the first transparent electrode sheet 11 which does not face the second transparent electrode sheet 21 and the light control layer 31. The first transparent electrode terminal 13 is connected to the flexible wiring board via a conductive adhesive. The conductive adhesive may be, for example, at least one selected from a group of an anisotropic conductive film (ACF), an anisotropic conductive paste (ACP), an isotropic conductive film (ICF), and an isotropic conductive paste (ICP).

Figure 3:
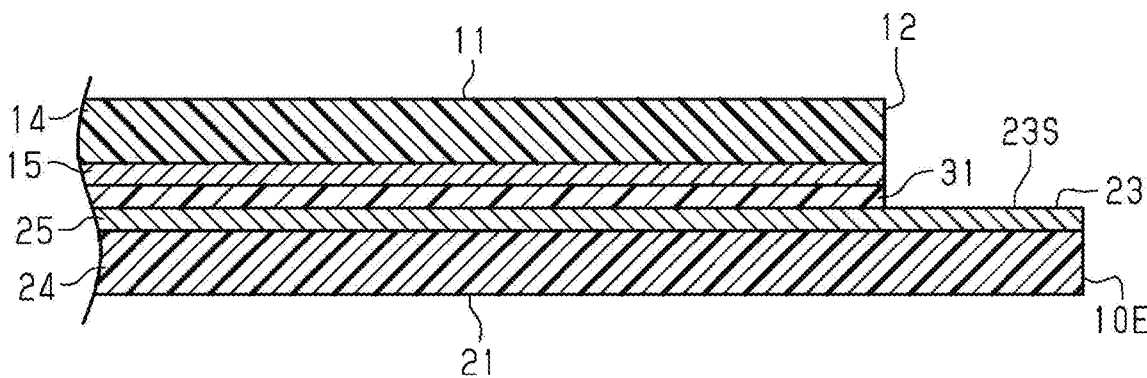
FIG. 3 is a cross-sectional view taken along line in FIG. 1.

As shown in FIG. 3, a second electrode surface 23S of the second transparent electrode layer 25 facing the light control layer 31 extends from the first terminal opening 12 to the edge 10E. The first terminal opening 12 defines the second transparent electrode terminal 23, which is a part of the second transparent electrode layer 25, in the second transparent electrode layer 25. The second transparent electrode terminal 23 is the part of the second electrode surface 23S surrounded by the first terminal opening 12 and the edge 10E of the light control sheet 10.

The first terminal opening 12 may be formed by cutting out a part of the first transparent electrode sheet 11 and a part of the light control layer 31. Alternatively, the first terminal opening 12 may be formed at a part of the second transparent electrode sheet 21 which does not face the first transparent electrode sheet 11 and the light control layer 31. The second transparent electrode terminal 23 is also connected to the flexible wiring board via a conductive adhesive.

The first transparent electrode terminal 13 has a shape corresponding to the shape of the second transparent electrode terminal 23 translated in the first direction D1. Note that the first transparent electrode terminal 13 may have a shape that is different from the shape of the second transparent electrode terminal 23 translated in the first direction D1. The light control layer 31 is located between the first and second transparent electrode layers 15 and 25 so that the first and second transparent electrode terminals 13 and 23 are exposed from the light control layer 31.

Flexible Wiring Board

Figure 4:
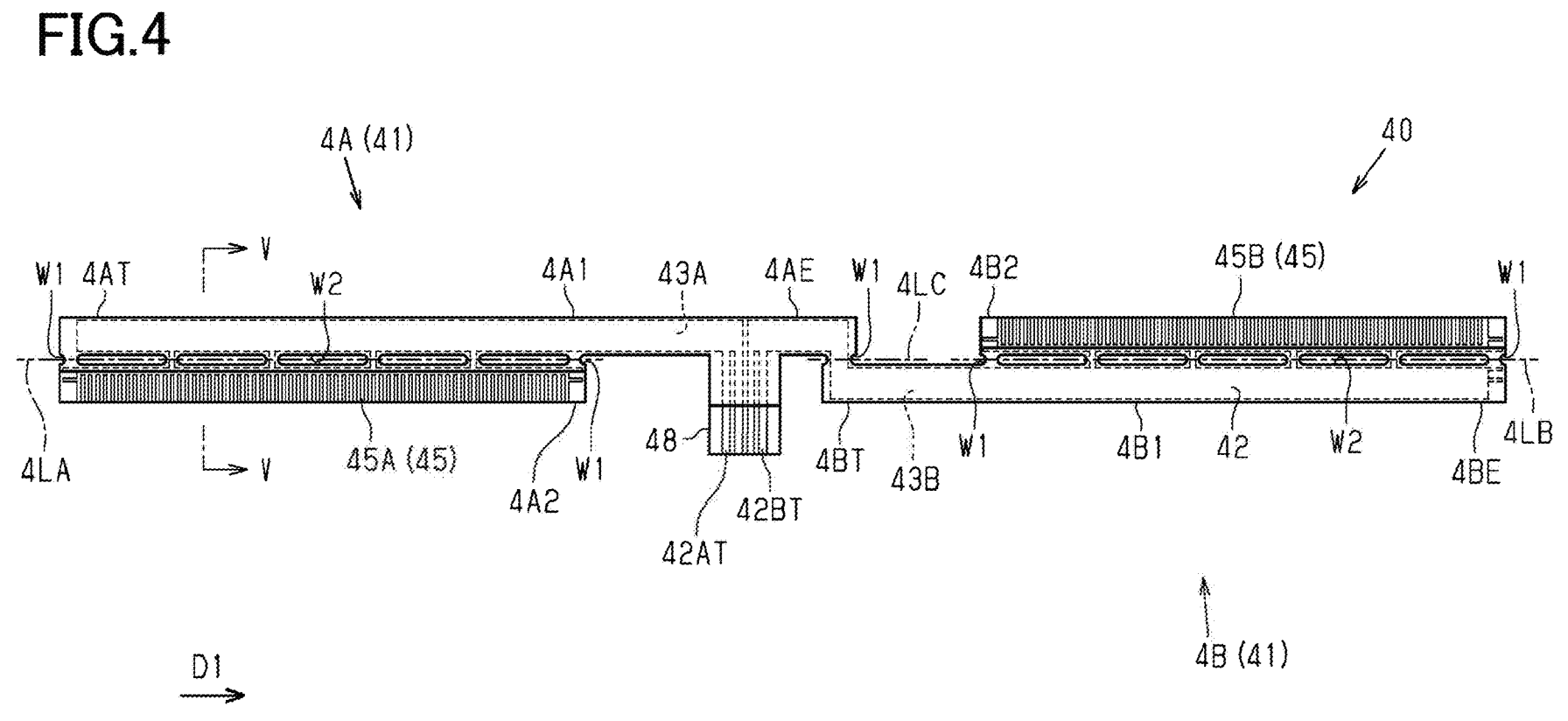

As shown in FIG. 4, a flexible wiring board 40 has a strip-like shape extending in the first direction D1. The flexible wiring board 40 includes an insulating layer 41, a protective layer 42, and a conductive layer 45. The outer shape of the insulating layer 41 follows the outer shape of the flexible wiring board 40. The insulating layer 41 is a resin base sheet. In FIG. 4, of the two spaces separated by a plane in which the flexible wiring board 40 extends, the space in contact with the protective layer 42 is the first space. Of the two spaces separated by the plane in which the flexible wiring board 40 extends, the space in contact with the insulating layer 41 is the second space.

The flexible wiring board 40 includes bend-guide recesses W1 formed in the first direction D1 and bend-guide through holes W2 formed in the first direction D1. The bend-guide recesses W1 have, in the outline of the flexible wiring board 40, a shape that is recessed in the first direction D1 or a shape that is recessed in the direction opposite to the first direction D1. The bend-guide through holes W2 are flattened elliptical holes extending in the first direction D1. The bend-guide recesses W1 and the bend-guide through holes W2 are located on a single straight fold line extending in the first direction D1. The bend-guide recesses W1 and the bend-guide through holes W2 are examples of weakened parts.

Figure 5:
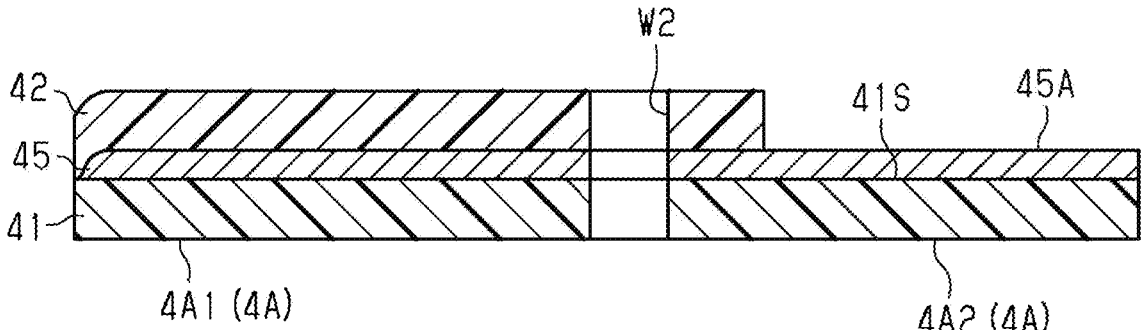
FIG. 5 is a cross-sectional view taken along line V-V in FIG. 4.

As shown in FIG. 5, the conductive layer 45 is located between the insulating layer 41 and protective layer 42. The insulating layer 41 supports the entire conductive layer 45. The surface of the insulating layer 41 that supports the entire conductive layer 45 is a support surface 41S. The support surface 41S is the upper surface of the insulating layer 41 in FIG. 5. The protective layer 42 covers part of the conductive layer 45 so that the other parts of the conductive layer 45 are exposed. The part of the conductive layer 45 exposed from the protective layer 42 is connected to the light control sheet 10 or an external power source.

The flexible wiring board 40 is a flexible printed circuit (FPC). The material of the insulating layer 41 is an insulating organic polymer compound or an insulating inorganic-organic hybrid material. The material of the protective layer 42 is also an insulating organic polymer compound. The materials of the insulating layer 41 and the protective layer 42 may be, for example, at least one selected from a group of polyimide and polyester. An example of the material of the conductive layer 45 is at least one selected from a group of a copper thin film, an aluminum thin film, and a nickel thin film.

Insulating Layer

Returning to FIG. 4, in the first direction D1, the insulating layer 41 is virtually divided into a first support piece 4A located on the left in FIG. 4 and a second support piece 4B located on the right in FIG. 4. The first support piece 4A is integral with the second support piece 4B. The first and second support pieces 4A and 4B form a single resin sheet. The resin sheet may have a single layer structure made of one resin film, or a laminated structure made of two or more resin films.

The first support piece 4A includes a base end part of the insulating layer 41 in the first direction D1. The first support piece 4A has a strip-like shape extending in the first direction D1. A first base end part 4AT of the first support piece 4A includes the base end of the first support piece 4A in the first direction D1. A first tip end part 4AE of the first support piece 4A includes the tip end of the first support piece 4A in the first direction D1. The first base end part 4AT constitutes the base end part of the insulating layer 41 in the first direction D1. The first tip end part 4AE is the part of the first support piece 4A that connects to the second support piece 4B.

The second support piece 4B includes a tip end part of the insulating layer 41 in the first direction D1. The second support piece 4B has a strip-like shape extending in the first direction D1. The length of the second support piece 4B in the first direction D1 is approximately the same as the length of the first support piece 4A in the first direction D1. A second base end part 4BT of the second support piece 4B includes the base end of the second support piece 4B in the first direction D1. A second tip end part 4BE of the second support piece 4B includes the tip end of the second support piece 4B in the first direction D1. The second tip end part 4BE constitutes the tip end part of the insulating layer 41 in the first direction D1. The second base end part 4BT is the part of the second support piece 4B that connects to the first support piece 4A.

In the insulating layer 41, the first tip end part 4AE of the first support piece 4A is integral with the second base end part 4BT of the second support piece 4B. The boundary between the first tip end part 4AE of the first support piece 4A and the second base end part 4BT of the second support piece 4B is located approximately at the center of the insulating layer 41 in the first direction D1. The boundary line between the first tip end part 4AE and the second base end part 4BT lies on a third straight guide line 4LC extending in the first direction D1. The boundary line between the first tip end part 4AE and the second base end part 4BT extends between a bend-guide recess W1 that is recessed in the first direction D1 and another bend-guide recess W1 that is recessed in the direction opposite to the first direction D1. The two bend-guide recesses W1 sandwiching the boundary line between the first tip end part 4AE and the second base end part 4BT induce the flexible wiring board 40 to fold along the straight guide line 4LC.

The first support piece 4A includes a first folded part 4A1 having a strip-like shape extending in the first direction D1, and a first terminal support part 4A2 having a strip-like shape extending in the first direction D1. The first folded part 4A1 and the first terminal support part 4A2 are formed next to each other in a direction perpendicular to the first direction D1. The length of the first folded part 4A1 in the first direction D1 is greater than the length of the first terminal support part 4A2 in the first direction D1. The base end part of the first folded part 4A1 in the first direction D1 and the base end part of the first terminal support part 4A2 in the first direction D1 constitute the first base end part 4AT of the first support piece 4A. The tip end part of the first folded part 4A1 in the first direction D1 is the first tip end part 4AE of the first support piece 4A.

The first folded part 4A1 is integral with the first terminal support part 4A2. The boundary line between the first folded part 4A1 and the first terminal support part 4A2 lies on a first straight guide line 4LA extending in the first direction D1. The boundary line between the first folded part 4A1 and the first terminal support part 4A2 extends between a bend-guide recess W1 that is recessed in the first direction D1 and another bend-guide recess W1 that is recessed in the direction opposite to the first direction D1. Five bend-guide through holes W2 are located on the boundary line between the first folded part 4A1 and the first terminal support part 4A2. The two bend-guide recesses W1 sandwiching the boundary line between the first folded part 4A1 and the first terminal support part 4A2 induce the insulating layer 41 to fold along the straight guide line 4LA. The five bend-guide through holes W2 located on the boundary line between the first folded part 4A1 and the first terminal support part 4A2 also induce the insulating layer 41 to fold along the straight guide line 4LA.

The second support piece 4B includes a second folded part 4B1 having a strip-like shape extending in the first direction D1, and a second terminal support part 4B2 having a strip-like shape extending in the first direction D1. The second folded part 4B1 and the second terminal support part 4B2 are formed next to each other in a direction perpendicular to the first direction D1. The length of the second folded part 4B1 in the first direction D1 is greater than the length of the second terminal support part 4B2 in the first direction D1. The tip end part of the second folded part 4B1 in the first direction D1 and the tip end part of the second terminal support part 4B2 in the first direction D1 constitute the second tip end part 4BE of the second support piece 4B. The base end part of the second folded part 4B1 in the first direction D1 is the second base end part 4BT of the second support piece 4B.

The second folded part 4B1 is integral with the second terminal support part 4B2. The boundary line between the second folded part 4B1 and the second terminal support part 4B2 lies on a second straight guide line 4LB extending in the first direction D1. The boundary line between the second folded part 4B1 and the second terminal support part 4B2 extends between two bend-guide recesses W1. Five bend-guide through holes W2 are located on the boundary line between the second folded part 4B1 and the second terminal support part 4B2. The two bend-guide recesses W1 sandwiching the boundary line between the second folded part 4B1 and the second terminal support part 4B2 induce the insulating layer 41 to fold along the straight guide line 4LB. The five bend-guide through holes W2 located on the boundary line between the second folded part 4B1 and the second terminal support part 4B2 also induce the insulating layer 41 to fold along the straight guide line 4LB.

The flexible wiring board 40 defines the three virtual straight guide lines 4LA, 4LB and 4LC extending in the first direction D1. The three straight guide lines 4LA, 4LB and 4LC lie on a single straight fold line extending in the first direction D1.

The first folded part 4A1 is located on a side of the straight guide line 4LA opposite to that on which the first terminal support part 4A2 is located. The second folded part 4B1 is located on a side of the straight guide line 4LB opposite to that on which the second terminal support part 4B2 is located. The first folded part 4A1 is located on a side of the single straight fold line, on which the three straight guide lines 4LA, 4LB and 4LC lie, opposite to that on which the second folded part 4B1 is located. The first terminal support part 4A2 is located on a side of the single straight fold line, on which the three straight guide lines 4LA, 4LB and 4LC lie, opposite to that on which the second terminal support part 4B2 is located.

The shape of the first terminal support part 4A2 and the shape of the second terminal support part 4B2 are point-symmetric about a point on the single straight fold line on which the three straight guide lines 4LA, 4LB and 4LC lie. For example, the shape of the first terminal support part 4A2 and the shape of the second terminal support part 4B2 are point-symmetric about a point that is on the single straight fold line on which the three straight guide lines 4LA, 4LB and 4LC lie and is at the midpoint between the first and second terminal support parts 4A2 and 4B2.

The tip end part of the first folded part 4A1 is connected to an external terminal support part 48. The external terminal support part 48 is located on a side of the straight guide line 4LA opposite to that on which the first folded part 4A1 is located. The external terminal support part 48 extends from the tip end part of the first folded part 4A1 in a direction perpendicular to the first direction D1, and is located on the same side of the straight guide line 4LA as the first terminal support part 4A2.

Conductive Layer

The conductive layer 45 is divided into a first conductive layer and a second conductive layer in the first direction D1. The first conductive layer is the part of the conductive layer 45 on the left in FIG. 4. The second conductive layer is the part of the conductive layer 45 on the right in FIG. 4. The first and second conductive layers are electrically isolated from each other.

The first conductive layer includes a first sheet adhesive terminal 45A having a strip-like shape extending in the first direction D1, and a first folded wiring 43A having a strip-like shape extending in the first direction D1. The first sheet adhesive terminal 45A and the first folded wiring 43A are positioned next to each other in a direction perpendicular to the first direction D1. The length of the first folded wiring 43A in the first direction D1 is greater than the length of the first sheet adhesive terminal 45A in the first direction D1.

The base end part of the first sheet adhesive terminal 45A in the first direction D1 and the base end part of the first folded wiring 43A in the first direction D1 constitute the base end part of the first conductive layer in the first direction D1.

The first sheet adhesive terminal 45A includes a comb-shaped terminal positioned in the first direction D1. The entire first sheet adhesive terminal 45A is supported by the first terminal support part 4A2 of the first support piece 4A. The entire first folded wiring 43A is supported by the first folded part 4A1 of the first support piece 4A, and the external terminal support part 48.

The boundary line between the first sheet adhesive terminal 45A and the first folded wiring 43A lies on the first straight guide line 4LA. The first sheet adhesive terminal 45A is integral with the first folded wiring 43A and is electrically connected to the first folded wiring 43A via the periphery of the bend-guide through holes W2. Five bend-guide through holes W2 are located on the boundary line between the first sheet adhesive terminal 45A and the first folded wiring 43A. The five bend-guide through holes W2 located on the boundary line between the first sheet adhesive terminal 45A and the first folded wiring 43A induce the conductive layer to fold along the straight guide line 4LA as in the first support piece 4A.

The first sheet adhesive terminal 45A is exposed from the protective layer 42 to the first space. The first space side of the first folded wiring 43A is covered with the protective layer 42.

The tip end part of the first folded wiring 43A in the first direction D1 is bent in a direction perpendicular to the first direction D1. The tip end of the first folded wiring 43A in the first direction D1 is a first power supply terminal 42AT and is supported by the external terminal support part 48. As with the first sheet adhesive terminal 45A, the first power supply terminal 42AT is exposed from the protective layer 42 to the first space.

The second conductive layer includes a second sheet adhesive terminal 45B having a strip-like shape extending in the first direction D1, and a second folded wiring 43B having a strip-like shape extending in the first direction D1. The second sheet adhesive terminal 45B and the second folded wiring 43B are positioned next to each other in a direction perpendicular to the first direction D1. The length of the second folded wiring 43B in the first direction D1 is greater than the length of the second sheet adhesive terminal 45B in the first direction D1. The tip end part of the second sheet adhesive terminal 45B in the first direction D1 and the tip end part of the second folded wiring 43B in the first direction D1 constitute the tip end part of the second conductive layer in the first direction D1.

The second sheet adhesive terminal 45B includes a comb-shaped terminal positioned in the first direction D1. The entire second sheet adhesive terminal 45B is supported by the second terminal support part 4B2 of the second support piece 4B. The entire second folded wiring 43B is supported by the second folded part 4B1 of the second support piece 4B, the tip end part of the first support piece 4A, and the external terminal support part 48.

The boundary line between the second sheet adhesive terminal 45B and the second folded wiring 43B lies on the second straight guide line 4LB. The second sheet adhesive terminal 45B is integral with the second folded wiring 43B and is electrically connected to the second folded wiring 43B via the periphery of the bend-guide through holes W2. Five bend-guide through holes W2 are located on the boundary line between the second sheet adhesive terminal 45B and the second folded wiring 43B. The five bend-guide through holes W2 located on the boundary line between the second sheet adhesive terminal 45B and the second folded wiring 43B induce the conductive layer 45 to fold along the straight guide line 4LB as in the second support piece 4B.

As with the first sheet adhesive terminal 45A, the second sheet adhesive terminal 45B is exposed from the protective layer 42 to the first space. As with the first folded wiring 43A, the first space side of the second folded wiring 43B is covered with the protective layer 42. The base end part of the second folded wiring 43B in the first direction D1 is bent once in a direction perpendicular to the first direction D1, and once in a direction opposite to that direction. The base end part of the second folded wiring 43B in the first direction D1 is bent once so that it crosses the boundary between the first and second support pieces 4A and 4B and bent once from the tip end part of the first support piece 4A toward the external terminal support part 48. The base end of the second folded wiring 43B in the first direction D1 is a second power supply terminal 42BT and is supported by the external terminal support part 48. As with the second sheet adhesive terminal 45B, the second power supply terminal 42BT is exposed from the protective layer 42 to the first space.

The first sheet adhesive terminal 45A is located on a side of the straight guide line 4LA opposite to that on which the first folded wiring 43A is located. The second sheet adhesive terminal 45B is located on a side of the straight guide line 4LB opposite to that on which the second folded wiring 43B is located. The first sheet adhesive terminal 45A is located on a side of the single straight fold line, on which the three straight guide lines 4LA, 4LB and 4LC lie, opposite to that on which the second sheet adhesive terminal 45B is located. The first folded wiring 43A extends from the first sheet adhesive terminal 45A toward the second sheet terminal 45B. The second folded wiring 43B extends from the second sheet adhesive terminal 45B toward the first sheet adhesive terminal 45A.

The shape of the first sheet adhesive terminal 45A and the shape of the second sheet adhesive terminal 45B are point-symmetric about a point on the single straight fold line on which the three straight guide lines 4LA, 4LB and 4LC lie. For example, the shape of the first sheet adhesive terminal 45A and the shape of the second sheet adhesive terminal 45B are point-symmetric about a point that is on the single straight fold line on which the three straight guide lines 4LA, 4LB and 4LC lie and is at the midpoint between the first and second sheet adhesive terminals 45A and 45B.

The external terminal support part 48, the first power supply terminal 42AT, which is the tip end of the first folded wiring 43A, and the second power supply terminal 42BT, which is the base end of the second folded wiring 43B, constitute external connection terminals.

Light Control Unit

Next, a method of bonding the flexible wiring board 40 to the light control sheet 10, that is, a method of manufacturing a light control unit will be explained.

Figure 6:
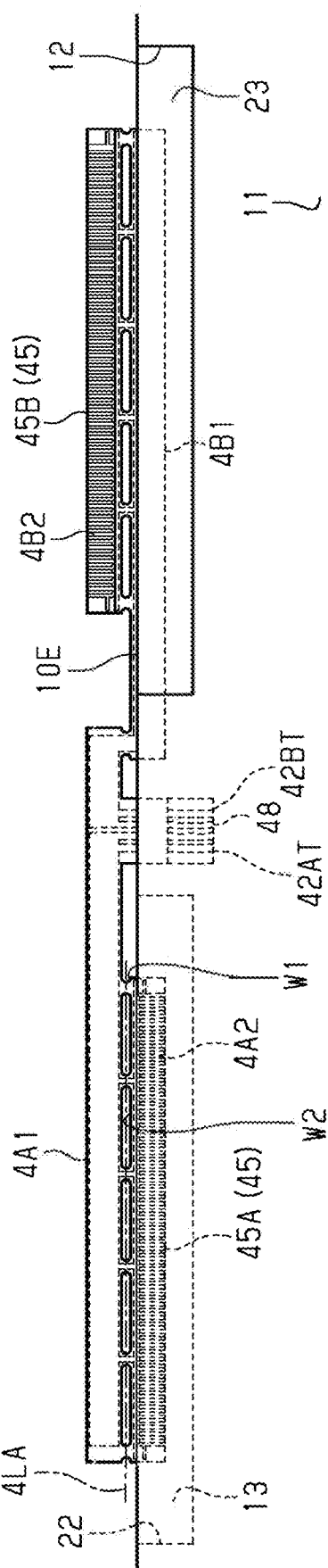
FIG. 6 is a process diagram showing a method of bonding a flexible wiring board to a light control sheet.

As shown in FIG. 6, when the flexible wiring board 40 is bonded to the light control sheet 10, first, the flexible wiring board 40 is placed so that the first sheet adhesive terminal 45A faces the first transparent electrode terminal 13. Further, the flexible wiring board 40 is placed so that the straight guide lines 4LA, 4LB and 4LC of the flexible wiring board 40 substantially coincide with the edge 10E of the light control sheet 10. Then, the first sheet adhesive terminal 45A is bonded to the first transparent electrode terminal 13 via a conductive adhesive.

Note that the first sheet adhesive terminal 45A faces the first space defined by the light control sheet 10, whereas the first transparent electrode terminal 13 faces the second space defined by the light control sheet 10. As shown by the dotted line in FIG. 6, the second folded part 4B1 and the external terminal support part 48 are formed on the second space side of the second transparent electrode sheet 21. As with the first sheet adhesive terminal 45A, the second sheet adhesive terminal 45B also faces the first space defined by the light control sheet 10.

Figure 7:
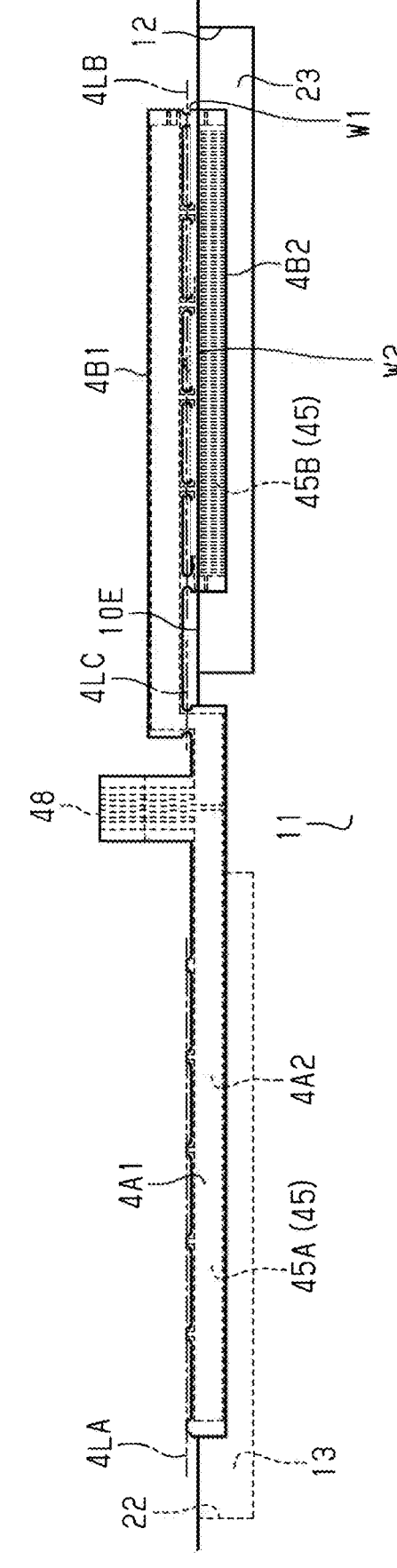
FIG. 7 is a process diagram showing a method of bonding a flexible wiring board to a light control sheet.

As shown in FIG. 7, when the first sheet adhesive terminal 45A and the first transparent electrode terminal 13 are bonded together, the first folded part 4A1 is folded along the straight guide line 4LA. The first folded part 4A1 folded along the straight guide line 4LA is placed so that it is on a side of the first transparent electrode sheet 11 opposite to that facing the second transparent electrode sheet 21, and covers the first transparent electrode sheet 11. That is, the first folded part 4A1 is placed on the first space side of the first transparent electrode sheet 11.

At this time, the second folded part 4B1 connecting to the first folded part 4A1 and the second sheet adhesive terminal 45B are also folded to be placed on a side of the first transparent electrode sheet 11 opposite to that facing the second transparent electrode sheet 21 together with the first folded part 4A1. The second sheet adhesive terminal 45B folded together with the first folded part 4A1 faces the second space and also faces the second transparent electrode terminal 23 via the first terminal opening 12.

Therefore, the second sheet adhesive terminal 45B has a shape obtained by translating the shape of the first sheet adhesive terminal 45A along the straight guide lines 4LA, 4LB and 4LC. Further, the second sheet adhesive terminal 45B is spaced apart from the first sheet adhesive terminal 45A in the first direction D1, and located on the support surface of the insulating layer 41 on a side of the straight guide lines 4LA, 4LB and 4LC opposite to that on which the first sheet adhesive terminal 45A is located. The second sheet adhesive terminal 45B is bonded to the second transparent electrode terminal 23 via a conductive adhesive.

Note that the second sheet adhesive terminal 45B faces the second space, whereas the second transparent electrode terminal 23 faces the first space. Further, as shown by the dotted line in FIG. 7, the first and second power supply terminals 42AT and 42BT on the external terminal support part 48 are located outside the light control sheet 10 and face the second space like the second sheet adhesive terminal 45B.

Figure 8:
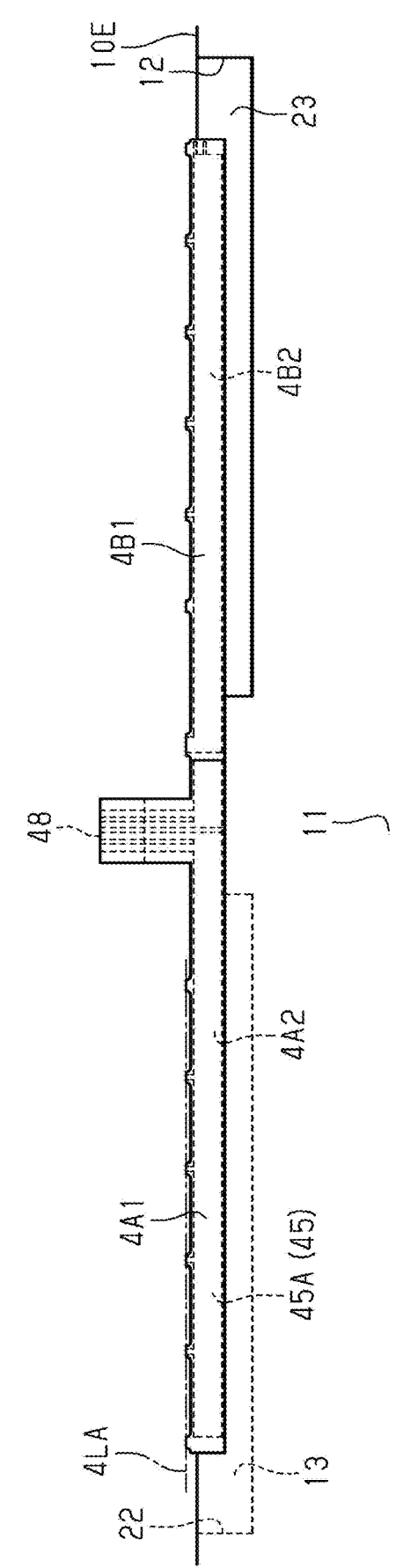
FIG. 8 is a process diagram showing a method of bonding a flexible wiring board to a light control sheet.

As shown in FIG. 8, when the second sheet adhesive terminal 45B and the second transparent electrode terminal 23 are bonded together, the second folded part 4B1 is folded along the straight guide lines 4LB and 4LC. The second folded part 4B1 folded along the straight guide lines 4LB and 4LC is placed so that it is on a side of the first transparent electrode sheet 11 opposite to that facing the second transparent electrode sheet 21, and covers the second terminal support part 4B2.

As a result, an edge part of the flexible wiring board 40 folded along the straight guide lines 4LA, 4LB and 4LC substantially coincides with the edge 10E of the light control sheet 10. Then, the flexible wiring board 40 is bonded to the light control sheet 10 so that only the external terminal support part 48 protrudes from the edge 10E of the light control sheet 10. The light control unit is thus manufactured.

Figure 9:
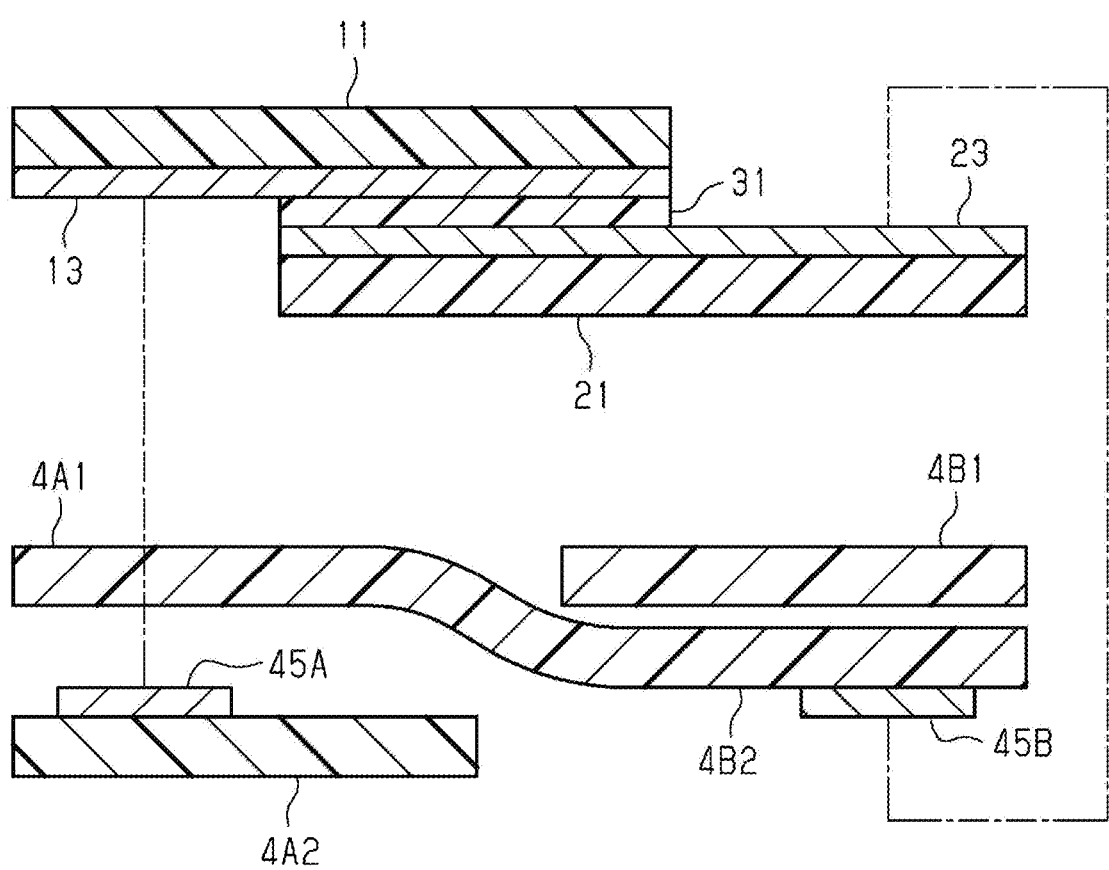
FIG. 9 is a cross-sectional view showing the position of the flexible wiring board in the light control unit.

That is, as shown in FIG. 9, the first folded part 4A1 is folded so that the first folded part 4A1 and the first terminal support part 4A2 sandwich the first transparent electrode sheet 11 therebetween. The second folded part 4B1 is folded so that the second folded part 4B1 and the second terminal support part 4B2 overlap each other.

According to the above embodiments, the advantageous effects listed below can be obtained.

A single support surface 41S is divided into two areas by a single straight guide line 4LC. When the support surface 41S is folded along the straight guide line 4LC, the support surface 41S on the first support piece 4A, which is one of the areas, faces the first space defined by the light control sheet 10. On the other hand, the support surface 41S on the second support piece 4B, which is the other area, faces the second space defined by the light control sheet 10. Therefore, the first and second sheet adhesive terminals 45A and 45B face opposite sides. As a result, the flexible wiring board 40 having two sheet adhesive terminals 45A and 45B on one support surface 41S can be used as a double-sided board.

In addition, the shape of the first sheet adhesive terminal 45A and the shape of the second sheet adhesive terminal 45B are identical as viewed from a point on the single straight fold line on which the three straight guide lines 4LA, 4LB and 4LC lie. When one support surface 41S is folded along the straight guide line 4LC, the shape of the first sheet adhesive terminal 45A becomes the same as the shape obtained by translating the shape of the second sheet adhesive terminal 45B along the straight guide line 4LC. As a result, the sheet adhesive terminals 45A and 45B can be bonded to the transparent electrode terminals 13 and 23, respectively, which are located next to each other along the straight guide line 4LC and having the same shape.

Bend-guide recesses W1 and bend-guide through holes W2 are located on a straight fold line passing through the straight guide lines 4LA, 4LB and 4LC. Since the load required to fold the flexible wiring board 40 along the straight guide lines 4LA, 4LB and 4LC extending in the first direction D1 can be reduced, this further facilitates the use of the flexible wiring board 40 as the above-mentioned double-sided board.

When the first and second sheet adhesive terminals 45A and 45B are folded so that they face opposite sides, they are folded along the boundary line between the first tip end part 4AE of the first support piece 4A and the second base end part 4BT of the second support piece 4B. The load required for folding is reduced compared to the case where the entire first support piece 4A is folded or the entire second support piece 4B is folded.

The first folded wiring 43A connected to the first sheet adhesive terminal 45A extends toward the second sheet adhesive terminal 45B. This facilitates consolidation of the first folded wiring 43A connected to the first sheet adhesive terminal 45A and the second folded wiring 43B connected to the second sheet adhesive terminal 45B. As a result, the flexible wiring board 40 provides better integration in that the wirings are drawn out from a single place in a light control sheet 10 where they are consolidated. This improves the design of the light control unit.

Further, the straight guide line 4LA defined by the bend-guide recesses W1 and the bend-guide through holes W2 separates the first terminal support part 4A2 and the first folded part 4A1. This makes it possible to fold the first and second sheet adhesive terminals 45A and 45B in opposite directions so that the first terminal support part 4A2 and the first folded part 4A1 are also folded accordingly. As a result, the first terminal support part 4A2 and the first folded part 4A1 can be folded along the straight guide line 4LA so that they overlap each other. This prevents the first folded part 4A1 from protruding from an edge of the light control sheet 10 to which the first terminal support part 4A2 is bonded. As a result, the flexible wiring board 40 creates an integrated appearance between the single light control sheet 10 and the flexible wiring board 40, which improves the design of the light control unit.

The second folded wiring 43B connected to the second sheet adhesive terminal 45B extends toward the first sheet adhesive terminal 45A. This facilitates consolidation of the first folded wiring 43A connected to the first sheet adhesive terminal 45A and the second folded wiring 43B connected to the second sheet adhesive terminal 45B. As a result, the flexible wiring board 40 provides better integration in that the wirings are drawn out from a single place in a light control sheet 10 where they are consolidated. This improves the design of the light control unit.

Further, the straight guide line 4LB defined by the bend-guide recesses W1 and the bend-guide through holes W2 separates the second terminal support part 4B2 and the second folded part 4B1. This makes it possible to fold the first and second sheet adhesive terminals 45A and 45B in opposite directions so that the second terminal support part 4B2 and the second folded part 4B1 are also folded accordingly. As a result, the second terminal support part 4B2 and the second folded part 4B1 can be folded along the straight guide line 4LB so that they overlap each other. This prevents the second folded part 4B1 from protruding from an edge of the light control sheet 10 to which the second terminal support part 4B2 is bonded. As a result, the flexible wiring board 40 creates an integrated appearance between the single light control sheet 10 and the flexible wiring board 40, which improves the design of the light control unit.

The external terminal support part 48 extends from the first folded part 4A1 toward a side of the straight guide line 4LA opposite to that on which the first folded part 4A1 is located. That is, the external terminal support part 48 extends from the first folded part 4A1 toward the same side of the straight guide line 4LA as the first terminal support part 4A2. When the first terminal support part 4A2 and the first folded part 4A1 are folded along the straight guide line 4LA, the external terminal support part 48 extends from the first folded part 4A1 toward a side of the straight guide line 4LA opposite to that on which the first terminal support part 4A2 is located. This makes it possible to pull out the external terminal support part 48 toward a side of the straight guide line 4LA opposite to that on which the first terminal support part 4A2 is located, that is, a side opposite to that on which the first transparent electrode terminal 13 is located. The flexible wiring board 40 provides better integration in that the wirings are drawn out from a single place in a light control sheet 10 where they are consolidated. This improves the design of the light control unit.

Since it is possible to adopt a single-sided flexible wiring board 40 that does not require through-holes, it is also possible to reduce restrictions on the fold parts due to the through holes being present.

The above embodiment may be modified and implemented as follows.

Weakened Part

The flexible wiring board 40 may have a configuration in which at least part of the bend-guide recesses W1 is omitted. The flexible wiring board 40 may have a configuration in which at least part of the bend-guide through holes W2 is omitted. In these cases, the flexible wiring board 40 may include, as a weakened part, an insulating layer 41 which is thinner than the parts other than the straight fold line at least in part of the straight fold line passing through the straight guide lines 4LA, 4LB and 4LC.

The weakened part in the flexible wiring board 40 may be omitted when the shape of the first sheet adhesive terminal 45A and the shape of the second sheet adhesive terminal 45B are point-symmetric about a point on the straight fold line on which the straight guide lines 4LA, 4LB, and 4LC lie.

The part of the first support piece 4A that connects to the second support piece 4B does not need to be the first tip end part 4AE of the first support piece 4A in the first direction D1. For example, the part of the first support piece 4A that connects to the second support piece 4B may be at a midpoint of the first support piece 4A in the first direction D1.

The part of the second support piece 4B that connects to the first support piece 4A does not need to be the base end part 4BT of the second support piece 4B in the first direction D1. For example, the part of the second support piece 4B that connects to the first support piece 4A may be at a midpoint of the second support piece 4B in the first direction D1.

Straight Fold Line

The first support piece 4A may have a configuration in which it cannot be folded along the boundary between the first folded part 4A1 and the first terminal support part 4A2. That is, the flexible wiring board 40 may have a configuration in which the straight guide line 4LA is omitted but has the straight guide lines 4LB and 4LC.

The second support piece 4B may have a configuration in which it cannot be folded along the boundary between the second folded part 4B1 and the second terminal support part 4B2. That is, the flexible wiring board 40 may have a configuration in which the straight guide line 4LB is omitted but has the straight guide lines 4LA and 4LC. The straight guide line 4LA may also be omitted from the flexible wiring board 40.

Sheet Adhesive Terminal

The shapes of the first and second sheet adhesive terminals 45A and 45B do not need to be point-symmetric. In this case, it suffices if the first and second sheet adhesive terminals 45A and 45B are spaced apart from each other in the first direction D1, and are located on the opposite sides of the straight fold line on which the straight guide lines 4LA, 4LB and 4LC lie.

The shapes of the first and second terminal support parts 4A2 and 4B2 do not need to be point-symmetric. In this case, it suffices if the first and second terminal support parts 4A2 and 4B2 are spaced apart from each other in the first direction D1, and are located on the opposite sides of the straight fold line on which the straight guide lines 4LA, 4LB and 4LC lie.

The first sheet adhesive terminal 45A is not limited to a single comb-shaped terminal but may be two or more comb-shaped terminals lined up in the first direction D1, or two or more blade terminals. The second sheet adhesive terminal 45B is not limited to a single comb-shaped terminal but may be two or more comb-shaped terminals lined up in the first direction D1, or two or more blade terminals. The number of the first sheet adhesive terminals 45A may be different from the number of the second sheet adhesive terminals 45B. In this case, it suffices if the first and second sheet adhesive terminals 45A and 45B are spaced apart from each other in the first direction D1, and are located on the opposite sides of the straight fold line on which the straight guide lines 4LA, 4LB and 4LC lie.

There may be more than one first folded wiring 43A. There may be one first folded wiring 43A for each comb-shaped terminal provided in the first sheet adhesive terminal 45A. There may be more than one second folded wiring 43B. There may be one second folded wiring 43B for each comb-shaped terminal provided in the second sheet adhesive terminal 45B. The number of the first folded wirings 43A may be different from the number of the second folded wirings 43B.

A light control sheet includes two transparent electrode layers facing each other. When a voltage is applied to a liquid crystal composition between the transparent electrode layers, it has a different light transmittance than before the application. The two transparent electrode layers are connected to an external power source via a flexible wiring board (see, for example, JP 2007-57925 A and JP 2020-38265 A). An example of the flexible wiring board includes adhesive terminals facing in opposite directions. The adhesive terminals are each connected to electrode terminals of the light control sheet.

Figure 10:
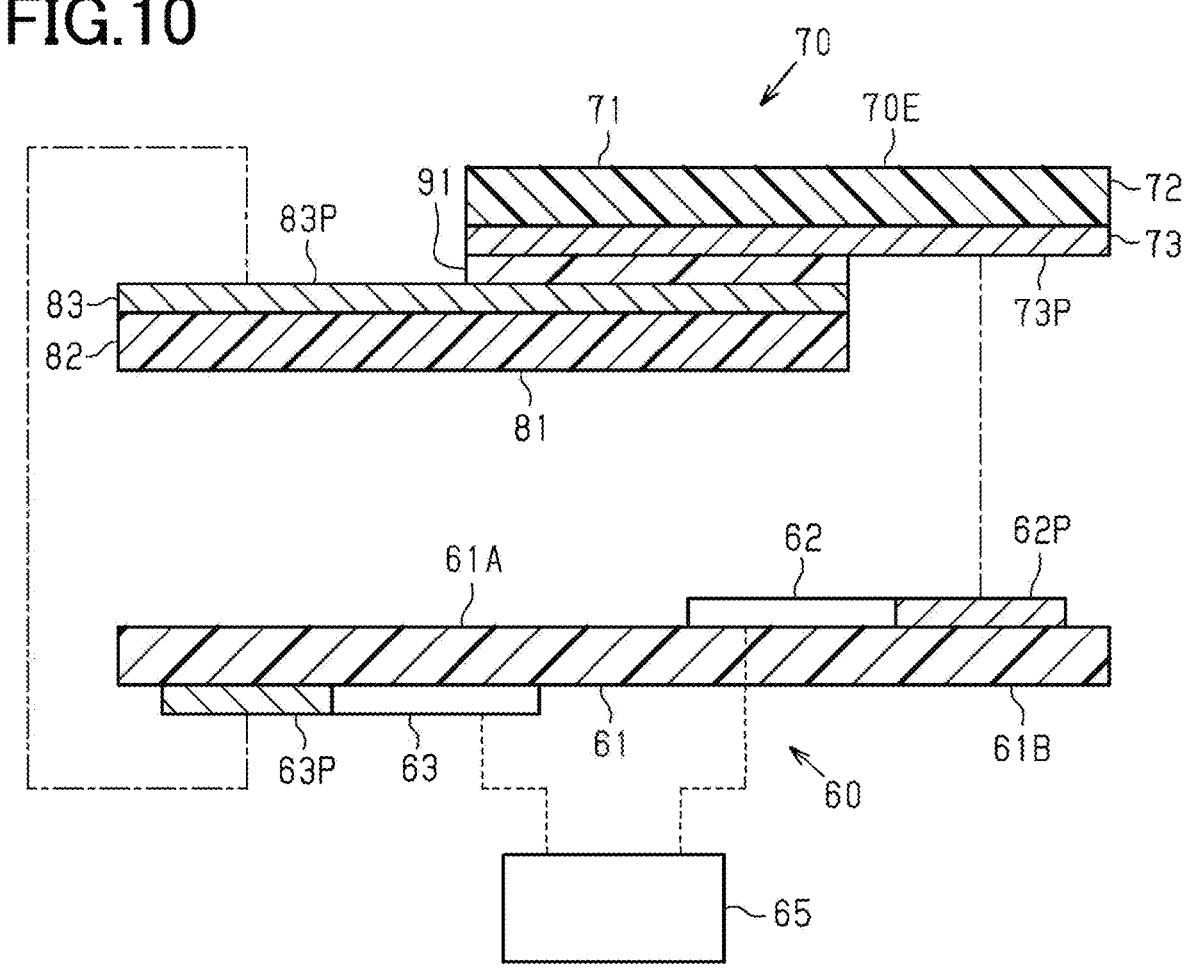
FIG. 10 is a cross-sectional view showing the position of the flexible wiring board in the light control unit.

For example, as shown in FIG. 10, a light control sheet 70 has a first transparent electrode layer 71, a second transparent electrode sheet 81, and a light control layer 91. The light control layer 91 is located between the first transparent electrode sheet 71 and the second transparent electrode sheet 81. The first transparent electrode sheet 71 includes a first transparent electrode layer 73 in contact with the light control layer 91, and a first support film 72. The second transparent electrode sheet 81 includes a second transparent electrode layer 83 in contact with the light control layer 91, and a second support film 82. The light control layer 91 located between the first and second transparent electrode layers 73 and 83 is driven by applying a voltage between the first and second transparent electrode layers 73 and 83.

The light control sheet 70 has an edge 70E that extends linearly from right to left in FIG. 10. A first transparent electrode terminal 73P of the first transparent electrode layer 73 and a second transparent electrode terminal 83P of the second transparent electrode layer 83 extend along the edge 70E of the light control sheet 70. The light control layer 91 is located between the first and second transparent electrode layers 73 and 83 so that the first and second transparent electrode terminals 73P and 83P are exposed from the light control layer 91.

The light control sheet 70 is connected to an external power source 65 through a flexible wiring board 60. The flexible wiring board 60 includes an insulating layer 61, a first conductive layer 62, and a second conductive layer 63. A first support surface 61A of the insulating layer 61 supports the first conductive layer 62. A second support surface 61B of the insulating layer 61 on a side facing away from the first support surface 61A supports the second conductive layer 63.

As indicated by the dotted line in FIG. 10, the first conductive layer 62 is connected to the external power source 65 through a through hole in the insulating layer 61. The second conductive layer 63 is connected to the external power source 65. As illustrated by the dot-dashed line in FIG. 10, a first sheet adhesive terminal 62P of the first conductive layer 62 is positioned so that it faces the first transparent electrode layer 73. The first sheet adhesive terminal 62P is bonded to the first transparent electrode terminal 73P via a conductive adhesive. The second sheet adhesive terminal 63P of the second conductive layer 63 is positioned so that it faces the second transparent electrode layer 83. The second sheet adhesive terminal 63P is bonded to the second transparent electrode terminal 83P via a conductive adhesive.

In addition, the flexible wiring board 60 in which the first support surface 61A supports the first conductive layer 62 and the second support surface 61B supports the second conductive layer 63 usually requires a protective layer covering the first conductive layer 62 and another separate protective layer covering the second conductive layer 63. This makes the double-sided flexible wiring board described above thicker than a single-sided flexible wiring board, and thus the double-sided flexible wiring board has reduced flexibility.

A flexible wiring board according to an embodiment of the present invention includes: an insulating layer having a support surface extending in a first direction; a first sheet adhesive terminal located on the support surface, the first sheet adhesive terminal extending in the first direction; and a second sheet adhesive terminal located on the support surface, the second sheet adhesive terminal extending in the first direction. The shape of the first sheet adhesive terminal and the shape of the second sheet adhesive terminal are point-symmetric about a point on a straight fold line extending in the first direction.

A light control unit according to an embodiment of the present invention includes: a light control sheet having an edge part extending in a first direction; and a flexible wiring board bonded to the edge part. The light control sheet includes a first transparent electrode layer having a first transparent electrode terminal on a first electrode surface, a second transparent electrode layer having a second transparent electrode terminal on a second electrode surface, and a light control layer located between the first and second electrode surfaces so that the first and second transparent electrode terminals are exposed from the light control layer. The first and second transparent electrode terminals constitute the edge part and are positioned in the first direction. The flexible wiring board includes an insulating layer including a support surface extending in the first direction, a first sheet adhesive terminal bonded to the first transparent electrode terminal, the first sheet adhesive terminal being located on the support surface and extending in the first direction, and a second sheet adhesive terminal bonded to the second transparent electrode terminal, the second sheet adhesive terminal being located on the support surface and extending in the first direction. The support surface is folded along a straight fold line extending in the first direction, and the first sheet adhesive terminal has a shape obtained by translating a shape of the second sheet adhesive terminal along the straight fold line.

According to the above configurations, a single support surface is divided into a first surface region and a second surface region by a straight fold line. When the support surface is folded along a straight fold line, the first surface region faces a first side, whereas the second surface region faces a second side opposite to the first side. The first and second sheet adhesive terminals face opposite sides. As a result, the flexible wiring board having two sheet adhesive terminals on one support surface can be used as a double-sided board.

In addition, the shape of the first sheet adhesive terminal and the shape of the second sheet adhesive terminal are identical as viewed from a point on the straight fold line. When one support surface is folded along the straight fold line, the shape of the first sheet adhesive terminal becomes the same as the shape obtained by translating the shape of the second sheet adhesive terminal along the straight fold line. As a result, a sheet adhesive terminal can be bonded to each of two adherent objects located next to each other along the straight fold line and having the same shape.

The flexible wiring board may include a weakened part on the straight fold line for inducing the flexible wiring board to fold along the straight fold line.

According to this configuration, since the load required to fold the flexible wiring board along the straight fold line extending in the first direction can be reduced, this further facilitates the use of the flexible wiring board as the above-mentioned double-sided board.

A flexible wiring board according to an embodiment of the present invention includes: an insulating layer having a support surface extending in a first direction; a first sheet adhesive terminal located on the support surface; and a second sheet adhesive terminal located on the support surface. It also includes a weakened part on a straight fold line extending in the first direction for inducing the flexible wiring board to fold along the straight fold line. The first sheet adhesive terminal is spaced from the second sheet adhesive terminal in the first direction, and is located on a side of the straight fold line opposite to that on which the second sheet adhesive terminal is located.

A light control unit according to an embodiment of the present invention includes: a light control sheet having an edge part extending in a first direction; and a flexible wiring board bonded to the edge part. The light control sheet includes a first transparent electrode layer having a first transparent electrode terminal on a first electrode surface, a second transparent electrode layer having a second transparent electrode terminal on a second electrode surface, and a light control layer located between the first and second electrode surfaces so that the first and second transparent electrode terminals are exposed from the light control layer. The first and second transparent electrode terminals constitute the edge part and are positioned in the first direction. The flexible wiring board includes an insulating layer including a support surface extending in the first direction, a first sheet adhesive terminal bonded to the first transparent electrode terminal, the first sheet adhesive terminal being located on the support surface, and a second sheet adhesive terminal bonded to the second transparent electrode terminal, the second sheet adhesive terminal being located on the support surface. The support surface is folded along a straight fold line extending in the first direction, and the first sheet adhesive terminal is spaced from the second sheet adhesive terminal in the first direction and is located on the support surface on a side of the straight fold line opposite to that on which the second sheet adhesive terminal is located.

According to the above flexible wiring board, the straight fold line defined by the weakened part divides one support surface into two surface regions. When the support surface is folded along the straight fold line, one surface region faces a first side of the support surface, whereas the other surface region faces a second side of the support surface opposite to the first side. The first sheet adhesive terminal faces the first side of the support surface, whereas the second sheet adhesive terminal faces the second side of the support surface. As a result, the flexible wiring board having two sheet adhesive terminals on one support surface can be used as a double-sided board.

In the above flexible substrate, the insulating layer may include a first support piece that supports the first sheet adhesive terminal, the first support piece extending in the first direction, and a second support piece that supports the second sheet adhesive terminal, the second support piece extending in the first direction. A part of the first support piece that connects to the second support piece is a tip end part of the first support piece in the first direction, and a part of the second support piece that connects to the first support piece is a base end part of the second support piece in the first direction. The flexible wiring board may include a weakened part on a boundary between the tip end part and the base end part.

According to the above flexible wiring board, the folding of the first and second sheet adhesive terminals to make them face opposite sides is carried out along the boundary line between the tip end part of the first support piece and the base end part of the second support piece. The load required for folding is reduced compared to the case where the entire first support piece is folded or the entire second support piece is folded.

In the flexible wiring board, the insulating layer may include a first support piece that supports the first sheet adhesive terminal, the first support piece extending in the first direction. The first support piece may include a first folded part that includes a tip end part of the first support piece in the first direction, the first folded part extending in the first direction, and a first terminal support part in which the first sheet adhesive terminal is located. The first folded part may be located on a side of the straight fold line opposite to that on which the first terminal support part is located and may include a wiring extending in the first direction from the first sheet adhesive terminal to the second sheet adhesive terminal. The flexible wiring board may include the weakened part on a boundary between the first folded part and the first terminal support part.

According to the above flexible wiring board, since the wiring connected to the first sheet adhesive terminal extends toward the second sheet adhesive terminal, the wiring connected to the first sheet adhesive terminal and the wiring connected to the second sheet adhesive terminal can be easily consolidated. As a result, the flexible wiring board provides better integration in that the wirings are drawn out from a single place in a light control sheet where they are consolidated, which improves the design of the light control unit. Further, since the straight fold line defined by the weakened part separates the first terminal support part and the first folded part, it becomes possible to fold the first and second sheet adhesive terminals in opposite directions so that the first terminal support part and the first folded part are also folded accordingly. This makes it possible to fold the first sheet adhesive terminal and the first folded part along the straight fold line so that they overlap each other. This prevents the first folded part from protruding from an edge of the light control sheet to which the first adhesive terminal is bonded. As a result, the flexible wiring board creates an integrated appearance between the single light control sheet and the flexible wiring board, which improves the design of the light control unit.

In the flexible wiring board, the insulating layer may include a second support piece that supports the second sheet adhesive terminal, the second support piece extending in the first direction. The second support piece may include a second folded part that includes a base end part of the second support piece in the first direction, the second folded part extending in the first direction, and a second terminal support part in which the second sheet adhesive terminal is located. The second folded part may be located on a side of the straight fold line opposite to that on which the second terminal support part is located and may include a wiring extending in the first direction from the second sheet adhesive terminal to the first sheet adhesive terminal. The flexible wiring board may include the weakened part on a boundary between the second folded part and the second terminal support part.

According to the above flexible wiring board, since the wiring connected to the second sheet adhesive terminal extends toward the first sheet adhesive terminal, the wiring connected to the first sheet adhesive terminal and the wiring connected to the second sheet adhesive terminal can be easily consolidated. As a result, the flexible wiring board provides better integration in that the wirings are drawn out from a single place in a light control sheet where they are consolidated, which improves the design of the light control unit. Further, since the straight fold line defined by the weakened part separates the second terminal support part and the second folded part, it becomes possible to fold the first and second sheet adhesive terminals in opposite directions so that the second terminal support part and the second folded part are also folded accordingly. This makes it possible to fold the second sheet adhesive terminal and the second folded part along the straight fold line so that they overlap each other. This prevents the second folded part from protruding from an edge of the light control sheet to which the second adhesive terminal is bonded. As a result, the flexible wiring board creates an integrated appearance between the single light control sheet and the flexible wiring board, which improves the design of the light control unit.

In the flexible wiring board, a part of the first support piece that connects to the second support piece may be a tip end part of the first support piece in the first direction, and a part of the second support piece that connects to the first support piece may be a base end part of the second support piece in the first direction. The flexible wiring board may include a weakened part on a boundary between the tip end part and the base end part.

According to the above flexible wiring board, the folding of the first and second sheet adhesive terminals to make them face opposite sides is carried out along the boundary line between the tip end part of the first support piece and the base end part of the second support piece. The load required for folding is reduced compared to the case where the entire first support piece is folded or the entire second support piece is folded.

The flexible wiring board may include an external connection terminal in which an end of the wiring extending from the first sheet adhesive terminal and an end of the wiring extending from the second sheet adhesive terminal are located. The external connection terminal may be the part of the flexible wiring board that connects to the first folded part, and may extend from the first folded part toward a side of the straight fold line opposite to that on which the first folded part is located.

According to the flexible wiring board, the external connection terminal extends from the first folded part toward a side of the straight fold line opposite to that on which the first folded part is located. That is, the external connection terminal extends from the first folded part toward the same side of the straight fold line as that in which the first terminal support part is located. When the first terminal support part and the first folded part are folded along the straight fold line, the external connection terminal extends from the first folded part toward a side of the straight fold line opposite to that on which the first terminal support part is located. This makes it possible to pull out the external connection terminal toward a side of the straight fold line opposite to that on which the object to which the first terminal support part should be connected is located. The flexible wiring board provides better integration in that the wirings are drawn out from a single place in a light control sheet where they are consolidated. This improves the design of the light control unit.

Obviously, numerous modifications and variations of the present invention are possible in light of the above teachings. It is therefore to be understood that within the scope of the appended claims, the invention may be practiced otherwise than as specifically described herein.

The invention claimed is:

1. A flexible wiring board, comprising:
an insulating layer having a support surface extending in a first direction;
a first sheet adhesive terminal positioned on the support surface and extending in the first direction; and
a second sheet adhesive terminal positioned on the support surface and extending in the first direction, wherein
a shape of the first sheet adhesive terminal and a shape of the second sheet adhesive terminal are point-symmetric about a point on a straight fold line extending in the first direction, and
the insulating layer includes a first support piece that supports the first sheet adhesive terminal and is extending in the first direction, and a second support piece that supports the second sheet adhesive terminal and is extending in the first direction, a part of the first support piece that connects to the second support piece is a tip end part of the first support piece in the first direction, a part of the second support piece that connects to the first support piece is a base end part of the second support piece in the first direction, and the flexible wiring board includes a weakened part on a boundary between the tip end part and the base end part.

2. The flexible wiring board according to claim 1, wherein the weakened part is formed on the straight fold line and configured to induce the flexible wiring board to fold along the straight fold line.

3. The flexible wiring board according to claim 2, wherein the first support piece includes a first folded part that includes the tip end part of the first support piece in the first direction and is extending in the first direction, and a first terminal support part in which the first sheet adhesive terminal is positioned, the first folded part is formed on a side of the straight fold line opposite to a side on which the first terminal support part is positioned and includes a wiring extending in the first direction from the first sheet adhesive terminal to the second sheet adhesive terminal, and the flexible wiring board includes the weakened part on a boundary between the first folded part and the first terminal support part.

4. The flexible wiring board according to claim 3, wherein the second support piece includes a second folded part that includes the base end part of the second support piece in the first direction and is extending in the first direction, and a second terminal support part in which the second sheet adhesive terminal is positioned, the second folded part is positioned on a side of the straight fold line opposite to a side on which the second terminal support part is positioned and includes a wiring extending in the first direction from the second sheet adhesive terminal to the first sheet adhesive terminal, and the flexible wiring board includes the weakened part on a boundary between the second folded part and the second terminal support part.

5. The flexible wiring board according to claim 1, wherein the first support piece includes a first folded part that includes the tip end part of the first support piece in the first direction and is extending in the first direction, and a first terminal support part in which the first sheet adhesive terminal is positioned, the first folded part is formed on a side of the straight fold line opposite to a side on which the first terminal support part is positioned and includes a wiring extending in the first direction from the first sheet adhesive terminal to the second sheet adhesive terminal, and the flexible wiring board includes the weakened part on a boundary between the first folded part and the first terminal support part.

6. The flexible wiring board according to claim 5, wherein the second support piece includes a second folded part that includes the base end part of the second support piece in the first direction and is extending in the first direction, and a second terminal support part in which the second sheet adhesive terminal is positioned, the second folded part is positioned on a side of the straight fold line opposite to a side on which the second terminal support part is positioned and includes a wiring extending in the first direction from the second sheet adhesive terminal to the first sheet adhesive terminal, and the flexible wiring board includes the weakened part on a boundary between the second folded part and the second terminal support part.

7. The flexible wiring board according to claim 6, further comprising:

an external connection terminal in which an end part of the wiring extending from the first sheet adhesive terminal and an end part of the wiring extending from the second sheet adhesive terminal are positioned, wherein the external connection terminal is a part of the flexible wiring board that connects to the first folded part and extends from the first folded part toward a side of the straight fold line opposite to a side on which the first folded part is positioned.

8. The flexible wiring board according to claim 6, further comprising:

an external connection terminal in which an end part of the wiring extending from the first sheet adhesive terminal and an end part of the wiring extending from the second sheet adhesive terminal are positioned.

9. A flexible wiring board comprising:

an insulating layer having a support surface extending in a first direction;

a first sheet adhesive terminal positioned on the support surface;

a second sheet adhesive terminal positioned on the support surface; and a weakened part formed on a straight fold line extending in the first direction and configured to induce the flexible wiring board to fold along the straight fold line, wherein the first sheet adhesive terminal is spaced from the second sheet adhesive terminal in the first direction and is positioned on a side of the straight fold line opposite to a side on which the second sheet adhesive terminal is positioned, and the insulating layer includes a first support piece that supports the first sheet adhesive terminal and is extending in the first direction, and a second support piece that supports the second sheet adhesive terminal and is extending in the first direction, a part of the first support piece that connects to the second support piece is a tip end part of the first support piece in the first direction, a part of the second support piece that connects to the first support piece is a base end part of the second support piece in the first direction, and the flexible wiring board includes the weakened part on a boundary between the tip end part and the base end part.

10. The flexible wiring board according to claim 9, wherein the first support piece includes a first folded part that includes the tip end part of the first support piece in the first direction and is extending in the first direction, and a first terminal support part in which the first sheet adhesive terminal is positioned, the first folded part is formed on a side of the straight fold line opposite to a side on which the first terminal support part is positioned and includes a wiring extending in the first direction from the first sheet adhesive terminal to the second sheet adhesive terminal, and the flexible wiring board includes the weakened part on a boundary between the first folded part and the first terminal support part.

11. The flexible wiring board according to claim 10, wherein the second support piece includes a second folded part that includes the base end part of the second support piece in the first direction and is extending in the first direction, and a second terminal support part in which the second sheet adhesive terminal is positioned, the second folded part is positioned on a side of the straight fold line opposite to a side on which the second terminal support part is positioned and includes a wiring extending in the first direction from the second sheet adhesive terminal to the first sheet adhesive terminal, and the flexible wiring board includes the weakened part on a boundary between the second folded part and the second terminal support part.

12. The flexible wiring board claim 11, further comprising:

an external connection terminal in which an end part of the wiring extending from the first sheet adhesive terminal and an end part of the wiring extending from the second sheet adhesive terminal are positioned, wherein the external connection terminal is a part of the flexible wiring board that connects to the first folded part and extends from the first folded part toward a side of the straight fold line opposite to a side on which the first folded part is positioned.

13. The flexible wiring board claim 11, further comprising:

an external connection terminal in which an end part of the wiring extending from the first sheet adhesive terminal and an end part of the wiring extending from the second sheet adhesive terminal are positioned.

14. A light control unit, comprising:

a light control sheet having an edge part extending in a first direction; and a flexible wiring board bonded to the edge part of the light control sheet, wherein the light control sheet includes a first transparent electrode layer having a first transparent electrode terminal on a first electrode surface, a second transparent electrode layer having a second transparent electrode terminal on a second electrode surface, and a light control layer positioned between the first and second electrode surfaces such that the first and second transparent electrode terminals are exposed from the light control layer, the first and second transparent electrode terminals constitute the edge part and are positioned in the first direction, the flexible wiring board includes an insulating layer including a support surface extending in the first direction, a first sheet adhesive terminal bonded to the first transparent electrode terminal, positioned on the support surface and extending in the first direction, and a second sheet adhesive terminal bonded to the second transparent electrode terminal, positioned on the support surface and extending in the first direction, the support surface is folded along a straight fold line extending in the first direction, and the first sheet adhesive terminal has a shape obtained by translating a shape of the second sheet adhesive terminal along the straight fold line.

15. A light control unit, comprising:

a light control sheet having an edge part extending in a first direction; and a flexible wiring board bonded to the edge part of the light control sheet, wherein the light control sheet includes a first transparent electrode layer having a first transparent electrode terminal on a first electrode surface, a second transparent electrode layer having a second transparent electrode terminal on a second electrode surface, and a light control layer positioned between the first and second electrode surfaces such that the first and second transparent electrode terminals are exposed from the light control layer, the first and second transparent electrode terminals constitute the edge part and are positioned in the first direction, the flexible wiring board includes an insulating layer including a support surface extending in the first direction, a first sheet adhesive terminal bonded to the first transparent electrode terminal and positioned on the support surface, and a second sheet adhesive terminal bonded to the second transparent electrode terminal and is positioned on the support surface, the support surface is folded along a straight fold line extending in the first direction, and the first sheet adhesive terminal is spaced from the second sheet adhesive terminal in the first direction and is positioned on the support surface on a side of the straight fold line opposite to a side on which the second sheet adhesive terminal is positioned.

\* \* \* \* \*